United States Patent
Jaiswal et al.

(10) Patent No.: US 7,455,448 B2
(45) Date of Patent: Nov. 25, 2008

(54) RAPID THERMAL ANNEAL EQUIPMENT AND METHOD USING SICHROME FILM

(75) Inventors: Rajneesh Jaiswal, Tucson, AZ (US); Eric W. Beach, Tucson, AZ (US); Barbara M. Barnes, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 437 days.

(21) Appl. No.: 10/899,517

(22) Filed: Jul. 26, 2004

(65) Prior Publication Data

US 2006/0019415 A1    Jan. 26, 2006

(51) Int. Cl.
G01K 19/00 (2006.01)
G01K 7/02 (2006.01)
G01J 5/00 (2006.01)
G01N 25/00 (2006.01)

(52) U.S. Cl. .................. 374/1; 374/141; 374/43; 374/179; 374/121

(58) Field of Classification Search .......... 374/1, 374/141, 121, 179, 43
See application file for complete search history.

(56) References Cited

U.S. PATENT DOCUMENTS

| | | | | |
|---|---|---|---|---|
| 4,969,748 A | * | 11/1990 | Crowley et al. | 374/1 |
| 6,004,029 A | * | 12/1999 | Moslehi et al. | 374/1 |
| 6,033,922 A | * | 3/2000 | Rowland et al. | 438/14 |
| 6,106,148 A | * | 8/2000 | Moslehi et al. | 374/1 |
| 6,171,922 B1 | * | 1/2001 | Maghsoudnia | 438/385 |
| 6,200,023 B1 | * | 3/2001 | Tay et al. | 374/161 |
| 6,247,842 B1 | * | 6/2001 | Kitch et al. | 374/183 |
| 6,280,081 B1 | * | 8/2001 | Blau et al. | 374/1 |
| 6,293,696 B1 | * | 9/2001 | Guardado | 374/2 |
| 6,517,235 B2 | * | 2/2003 | Zhu et al. | 374/1 |
| 6,635,501 B1 | * | 10/2003 | Rowland | 438/14 |
| 7,192,494 B2 | * | 3/2007 | Chen et al. | 148/518 |

* cited by examiner

*Primary Examiner*—Edward Lefkowitz
*Assistant Examiner*—Mirellys Jagan
(74) *Attorney, Agent, or Firm*—Mirna Abyad; Wade J. Brady, III

(57) ABSTRACT

A method of determining the degree of calibration of an RTP chamber (1) includes providing a test wafer having a deposited sichrome layer (22) of sheet resistance Rsi on an oxide layer (21) formed on a silicon substrate (20). The test wafer is annealed in the RTP chamber for a selected duration at a selected anneal temperature which is measured by the a permanent thermocouple or pyrometer (8). The sheet resistance of the annealed sichrome is measured, and a sheet resistance change $\Delta Rs = Rsi - Rsf$ is computed. The "actual" value of the anneal temperature is determined from predetermined characterizing information relating $\Delta Rs$ to a range of values of anneal temperature. The RTP chamber is re-calibrated if in accordance with the value of $\Delta Rs$ if the difference between the "actual" value of the anneal temperature and the value measured by the permanent thermocouple or pyrometer exceeds an acceptable error. The basic technique can be utilized to determine an anneal time and anneal duration for annealing sichrome resistors to precisely adjust the sheet resistance or TCR thereof.

23 Claims, 2 Drawing Sheets

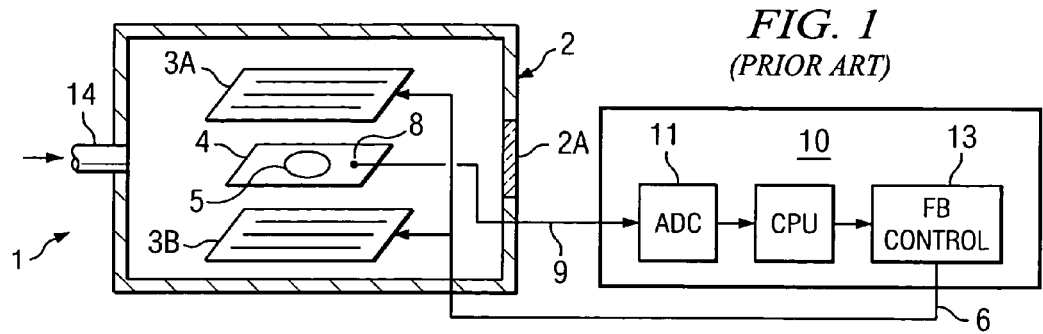
*FIG. 1*
(PRIOR ART)
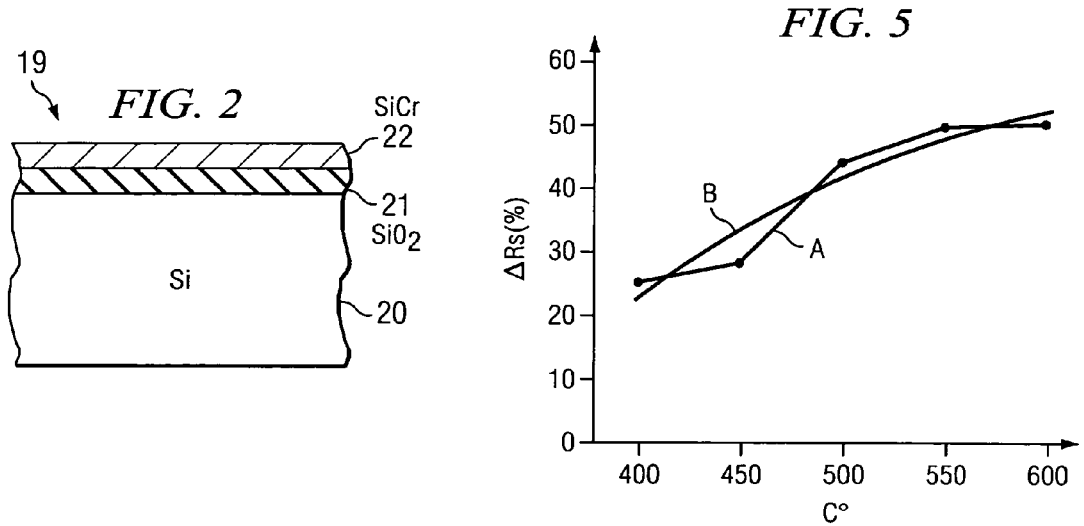
*FIG. 2*
*FIG. 5*
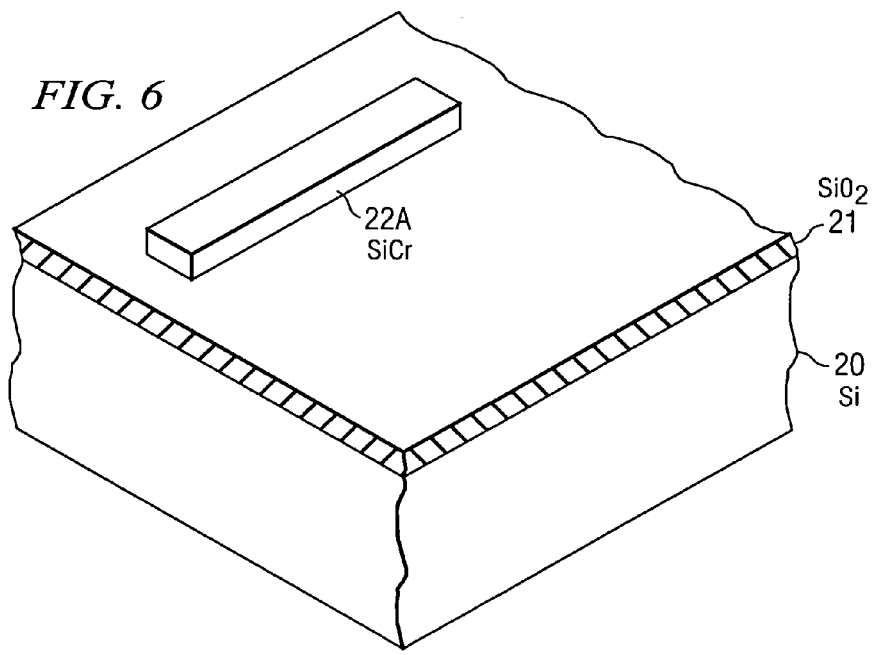
*FIG. 6*

RAPID THERMAL ANNEAL EQUIPMENT AND METHOD USING SICHROME FILM

BACKGROUND OF THE INVENTION

The present invention relates generally to rapid thermal anneal semiconductor processing equipment ("RTP equipment"), and particularly to a technique utilizing sichrome (SiCr) film material on semiconductor wafers for use in calibrating and/or monitoring the calibration of RTP equipment. The invention also relates to adjusting the sheet resistances and TCR (temperature coefficient of resistance) of sichrome film resistors in integrated circuits.

The term "RTP equipment" refers to "rapid thermal processing equipment". (The RTP equipment is sometimes also referred to as "RTA equipment" or "rapid thermal anneal" equipment.) A typical RTP chamber includes an oven or chamber the temperature of which is rapidly increased or "ramped up" during processing of a single integrated circuit wafer from about 300 degrees Centigrade to about 1200 degrees Centigrade. The chamber temperature is maintained at that temperature for a short time (e.g., 30 seconds to 5 minutes), and then the temperature is rapidly ramped back down to a low level, the wafer then is removed, and the anneal process is performed on another integrated circuit wafer. FIG. 1 is a generalized diagram of a typical RTP chamber 1.

Referring to FIG. 1, RTP chamber 1 includes a sealed housing 2 having a door 2A through which access to the interior of housing 2 can be achieved. An upper heating element 3A including an array of tungsten lamps is located above a boat 4 on which a semiconductor wafer 5 is supported. A lower heating element 3B also including an array of tungsten lamps is located below boat 4. Typically, a gas flow inlet 14 is provided through housing 2 to maintain a suitable ambient atmosphere within housing 2, either for performing a processing step on wafer 5 (such as oxide growth) or to provide an inert ambient atmosphere during the annealing process. A control system 10 of RTP chamber 1 includes a controller or CPU 12, an analog to digital converter 11, and a digital to analog control system 13 that controls, via power bus 6, the amount of power delivered to upper and lower heating elements 3A and 3B. A permanent thermocouple or pyrometer 8 for measuring the temperature of the wafer is coupled by a conductor or bus 9 to an analog input of analog to digital converter 11. (Alternatively, a pyrometer or other permanent or semi-permanent temperature measuring device, also referred to herein by reference numeral 8, can be provided to generate a signal representing the temperature within RTP chamber 1.) CPU or microcontroller 12 reads the digital output of analog to digital converter 11 and digitally processes it to provide a digital feedback signal on conductor 6 as an input to digital to analog converter power control system 13 to cause upper and lower heating elements 3A and 3B to maintain the temperature of wafer boat 4 and wafer 5 thereon precisely at any predetermined temperature within a wide range.

The temperature in RTP chamber 1 can be rapidly ramped up to the desired anneal temperature at the rate of approximately 50 to 150 degrees Centigrade per second by means of heating elements 3A and 3B. The anneal temperature can be precisely maintained for a desired anneal duration. The temperature in RTP chamber 1 can be ramped down at the rate of 100 to 150 degrees Centigrade per second just by turning off heating elements 3A and 3B.

Annealing operations are commonly used in implant "activation" processes, in silicide formation processes, and in oxidation processes. For example, oxide growth processes may include growth of gate oxides on silicon or growth of oxides on polycrystalline silicon. The silicide processes referred to may be for forming titanium silicide, cobalt silicide, or nickel silicide in contact structures in integrated circuits.

RTP chambers of the type described above with reference to FIG. 1 are commonly used in semiconductor manufacturing facilities to perform the above-mentioned annealing applications. The above-mentioned implant "activation" of ion implanted regions previously formed on/in the surface of a silicon wafer involves annealing the silicon wafer to drive the implanted P+ or N− ions (such as boron or arsenic ions) into the silicon to a desired junction depth to thereby activate free P+ or N− carriers in the implanted region. (Specifically, the implanting of the wafer surface with boron or arsenic ions or the like, followed by a suitable to rapid anneal, drives most of the implanted species into the crystal lattice at a desired junction depth. This activates the implanted species by modifying the band gap properties of the semiconductor material thereby producing mobile charge carriers in the implanted region of semiconductor material, reducing its resistivity and sheet resistance Rs. RTP chambers are also used for performing the above-mentioned silicide processes, and also for growing thin oxides or nitrides on silicon wafers.)

The above-mentioned silicide processes are used in manufacture of typical MOS (including CMOS) structures, the manufacture of which includes forming a thin gate oxide over the region between a source electrode region and a drain electrode region in a silicon wafer, forming a doped polycrystalline silicon ("poly") gate electrode on the gate oxide, and forming a layer of refractory metal such as titanium on the wafer. Then the wafer is placed in an RTP chamber and annealed at a particular anneal temperature for a particular anneal duration, e.g., at 600 degrees Centigrade for 30 seconds. This causes formation of titanium silicide (TiSix) in regions under the contact openings where silicon molecules are available to combine with the titanium. The titanium silicide has reduced sheet resistance and therefore provides lower contact resistance of the titanium metallization to the various MOS transistor electrodes. Often, a second annealing step is then performed at 750 degrees Centigrade, which causes formation of further formation of a stable and low resistance phase of titanium silicide TiSi2.

The above-mentioned annealing of implanted wafers and silicide formation on semiconductor wafers causes a reduction $\Delta Rs$ in the sheet resistance Rs of the implanted regions or silicided regions. The reduction in sheet resistance $\Delta Rs$ due to the annealing is a particular function of the anneal temperature if the anneal time is kept constant.

There are various causes of drift of the temperature in RTP chamber 1, including gradual deterioration of the lamps used as heating elements 3A and 3B and gradual deterioration of the accuracy of permanent thermocouple or pyrometer 8. Also, annealing of doped oxides in RTP chamber 1 may gradually contaminate it and cause errors in temperature measurements using permanent thermocouple or pyrometer 8.

Achieving accurate measurement and control of the temperature of RTP chamber 1 is very important in many applications because many anneal processes are very dependent on precise control of the RTP chamber anneal temperatures.

For example, in an annealing process for implant activation, the desired junction depth and sheet resistance may not be achieved if the anneal temperature is not accurately determined in the RTP chamber, even if the implant dose is correct. Also, in an annealing process used to grow silicon dioxide, the oxide thickness is likely to be unacceptably inaccurate if the annealing temperature is inaccurate. In a silicide annealing process, the silicide may propagate into the silicon and damage the crystal structure and/or result in a poor quality silicide that results in high contact resistance to electrodes of the transistors. In fact, some sub-micron semiconductor manufacturing processes cannot tolerate a variation of even as little as +−3 degrees Centigrade in the annealing temperatures in RTP chamber 1.

Known techniques for calibrating RTP chambers include use of a "thermocouple wafer", which includes a platinum thermocouple attached to a semiconductor wafer. The thermocouple wafer has to be placed within the RTP chamber and coupled to a data recording device, which requires more technically skilled personnel than is usually required for routine operation and maintenance of an RTP chamber used in a semiconductor manufacturing process. Therefore, use of a thermocouple wafer usually necessitates the inconvenience of scheduling the services of such skilled technical personnel.

An advantage of a thermocouple wafer is that it can be utilized to accurately calibrate the permanent thermocouple or pyrometer 8 of RTP chamber 1 over its entire operating temperature range, but unfortunately, the technique of using a thermocouple wafer to calibrate the interior temperature of an RTP chamber requires the above-mentioned connecting of the thermocouple wafer to the external data recording device by the above-mentioned skilled technical personnel. This is very time-consuming, necessitating a large amount of down time of the RTP chamber, and therefore is very costly.

As an example, if the thermocouple wafer has been installed in RTP chamber 1 and the temperature therein has been ramped up to a desired anneal temperature of 900 degrees Centigrade, permanent thermocouple or pyrometer 8 may indicate that the RTP chamber temperature is only 850 degrees Centigrade but the thermocouple wafer may indicate that the actual anneal temperature is 900 degrees Centigrade. This is likely to necessitate a re-calibration of RTP chamber 1, which can be accomplished in various ways. (However, sometimes what appears to be a temperature drift error of the permanent thermocouple or pyrometer 8 of RTP chamber 1 is actually caused by drift in the ion implanter (not shown) that implanted the test wafers to be used for calibrating or checking the calibration of the RTP chamber. To determine whether or not this is the case, the usual technique of monitoring the calibration of the RTP chamber includes implanting at least two different batches of implant test wafers, and then simultaneously annealing at least a wafer from each batch in RTP chamber 1 and obtaining a match. Subsequent batches have to be matched before one batch of wafers runs out. Then, if the measured sheet resistance change ΔRs due to the annealing is not the same for implant test wafers from the different batches, then the perceived temperature drift is considered to be actually caused by the drift of the implanter rather than drift of RTP chamber 1.)

If it is determined that calibration of RTP chamber 1 is required, the calibration may be accomplished by software executed by CPU 11 to modify the feedback on bus 6 to control heating lamps 3A and 3B so as to cause the actual temperature in RTP chamber 1 to precisely match a signal value or readout value produced by or in response to permanent thermocouple or pyrometer 8. Alternatively, software may be executed by CPU 11 to modify the readout of permanent thermocouple or pyrometer 8 so it precisely matches the actual temperature in RTP chamber 1.

As described above, utilizing a thermocouple wafer to calibrate temperatures of the RTP chamber as described above is very inconvenient because the thermocouple wafer must be installed in the chamber and also connected to a data recording device. Typically, the process of checking the calibration of RTP chamber 1 using a thermocouple wafer is a tedious process that often causes approximately one-half day to a full day of RTP chamber down time, which, of course is very costly.

In the prior art, it has been found necessary to prepare batches of "implant test wafers" and/or batches of "silicide test wafers" and to frequently anneal such test wafers using RTP chamber 1 and then determine values of sheet resistance change ΔRs in order to determine when calibration of RTP chamber 1 is needed in order to maintain the needed accuracy of the annealing temperatures.

Cobalt and titanium films oxidize rapidly in the presence of oxygen gas, and therefore such test wafers must be utilized soon after they are fabricated. Furthermore, the prior RTP chamber calibration techniques using ΔRs measurements of silicide test wafers are very dependent on the properties of the semiconductor substrate and on the ambient atmosphere in the RTP chamber during annealing of the wafers therein. Specifically, the sheet resistance of suicide is a strong function of how clean the silicon substrate is. The sheet resistance of suicide is also a strong function of the amount of contamination in the RTP chamber due to contamination from other processes or atmospheric leaks.

Furthermore, accurate determination of the actual effect of contamination in the RTP chamber due to prior processes therein is difficult and tedious, and accurate evaluation of the cleanness of silicon wafers also is difficult and tedious. Nevertheless, silicide processes have been used in calibrating and monitoring the calibration of RTP chambers because accurate data for ΔRs as a function of anneal temperature and anneal duration cannot be obtained from implant test wafers for temperatures in the range between 350 degrees and 700 degrees Centigrade.

The procedure for monitoring the accuracy of the RTP chamber using an implant test wafer has been to anneal it in the RTP chamber at the desired anneal temperature for the desired amount of anneal time and then obtain the resulting sheet resistance change ΔRs. The ΔRs value is compared to previously obtained characterization data of identical implant test wafers to determine the actual RTP chamber temperature. The implant anneals are good only in the temperature range between 900 and 1200 degrees Centigrade.

Values of ΔRs based on measurements of sheet resistance of batches of implant test wafers and/or silicide test wafers annealed in RTP chamber 1 when it is accurately calibrated can be used to determine the ΔRs values, within limited temperature ranges, as a function of the RTP chamber temperature measured by permanent thermocouple or pyrometer 8. A relatively linear curve in a range from approximately 600 degrees Centigrade to approximately 750 degrees centigrade can be generated based on measurements of the titanium silicide. Similarly, a fairly linear curve of sheet resistance change ΔRs due to a particular amount of annealing vs. the RTP chamber temperature in the range from approximately 900 degrees Centigrade to 1200 degrees Centigrade can be generated from measurements of sheet resistance of implanted wafers for certain implanted species. The linearity helps in calibrating the system for any temperature within the range and to some extent allows accurate extrapolation of temperatures beyond the actual data points.

In the prior art, however, accurate data points cannot be readily obtained based on sheet resistance measurements of either implanted test wafers or silicide test wafers for temperatures between about 700 degrees Centigrade and 900 degrees Centigrade. In this range, it is always necessary to undergo the time consuming and tedious effort of utilizing a thermocouple wafer to calibrate the RTP. This information can be used later to check whether it is necessary to calibrate RTP chamber 1 and also to calibrate it if necessary.

Thus, there is an unmet need for a method of providing improved accuracy in the calibration of RTP equipment.

There also is an unmet need for a method of providing improved accuracy in the calibration of RTP equipment and also avoiding the cost and time required for utilization of thermocouple wafers in the calibration.

There also is an unmet need for a method of providing improved accuracy in the calibration of RTP equipment and also avoiding the need to utilize highly trained technical personnel in performing the calibration.

There also is an unmet need for a method of avoiding long RTP chamber down time that previously has been required in order to calibrate RTP chambers and/or monitor the calibration thereof.

There also is an unmet need for a method of avoiding the need to use implant test wafers and/or silicide test wafers to calibrate an RTP chamber and/or monitor the calibration thereof.

There also is an unmet need for a method of providing more accurate control of anneal temperatures in an RTP chamber independently of substrate and ambient effects.

There also is an unmet need for a method of making an integrated circuit including a thin film resistor of improved accuracy and which nevertheless is less costly than prior thin film resistors.

SUMMARY OF THE INVENTION

It is an object of the present invention to provide improved accuracy in the calibration of RTP equipment.

It is another object of the present invention to provide improved accuracy in the calibration of RTP equipment and also avoid the cost and time required for utilization of thermocouple wafers in the calibration.

It is another object of the present invention to provide improved accuracy in the calibration of RTP equipment and also avoid the need to utilize highly trained technical personnel in performing the calibration.

It is another object of the invention to avoid long RTP chamber down time that previously has been required in order to calibrate RTP chambers and/or to monitor the calibration thereof.

It is another object of the invention to avoid the need to use implant test wafers and/or silicide test wafers to calibrate an RTP chamber and/or to monitor the calibration thereof.

It is another object of invention to provide more accurate control of anneal temperatures in an RTP chamber across a range of temperatures using a single methodology.

It is another object of the invention to provide more accurate control of anneal temperatures in an RTP chamber using a methodology that is independent of substrate and ambient effects.

It is another object of the invention to provide a method of making an integrated circuit including a thin film resistor of improved accuracy and which nevertheless is less costly than prior thin film resistors.

Briefly described, and in accordance with one embodiment, the present invention provides a method of determining the accuracy of calibration of an RTP chamber (1) by providing a test wafer including a deposited sichrome layer on an insulating layer formed on a silicon substrate, the sichrome layer having a pre-anneal sheet resistance Rsi. The test wafer is placed in the RTP chamber and subjected to annealing at a predetermined anneal temperature as measured by a temperature sensor (8) in the RTP chamber (1) for a predetermined anneal duration. The sheet resistance of the sichrome layer is measured to determine a post-anneal sheet resistance Rsf, and a sheet resistance change $\Delta Rs$ of the sichrome layer is computed by subtracting the post-anneal sheet resistance Rsf from the pre-anneal sheet resistance Rsi. An actual value of the anneal temperature corresponding to the computed sheet resistance change $\Delta Rs$ is determined from predetermined characterizing information representative of $\Delta Rs$ of the sichrome layer as a function of anneal temperature and anneal duration. A determination of the accuracy of the calibration of the RTP chamber is made by determining the difference between the actual anneal temperature corresponding to the computed sheet resistance change $\Delta Rs$ the predetermined anneal temperature as measured by a permanent temperature sensor (8) located in the RTP chamber.

In the described embodiments, the predetermined characterizing information representative of $\Delta Rs$ of the sichrome layer is obtained by preparing a batch of sichrome test wafers each having a sichrome layer (22) on an oxide layer (21) formed on a substrate (20), the sichrome layers having a pre-anneal sheet resistance Rsi. The test wafers are annealed at a various desired anneal temperatures for the predetermined anneal duration. The sheet resistance change $\Delta Rs=Rsi-Rsf$ of each annealed test wafer caused by the annealing is computed, and groups are formed of $\Delta Rs$ values of test wafers having the same anneal durations, respectively, to represent $\Delta Rs$ as a function of anneal temperature for each anneal duration value. The test wafers can be annealed in the RTP chamber (1). In the described embodiments, a polynomial expression is curve-fit to the $\Delta Rs$ values of test wafers having a selected anneal duration to represent a $\Delta Rs$ vs. anneal temperature curve for the selected anneal duration. The method is performed without using a thermocouple wafer, implant test wafer, or silicide test wafer.

In another embodiment, the invention provides a method of adjusting the sheet resistance and TCR of a sichrome resistor in an integrated circuit by providing a sichrome layer (22) on an insulating layer (21) formed on a wafer (19), the sichrome layer (22) having a pre-anneal sheet resistance Rsi. The wafer (19) is placed in a thermal chamber (1). An anneal temperature and an anneal duration corresponding a desired sheet resistance change $\Delta Rs$ is selected from predetermined characterizing information representative of $\Delta Rs$ of the sichrome layer (22) as a function of anneal temperature and anneal duration. The wafer (19) is subjected to annealing at the selected anneal temperature for the selected anneal duration so as to cause the desired sheet resistance change $\Delta Rs$ of the sichrome layer (22) so as to provide a post-anneal sheet resistance Rsf of the sichrome layer (22). The predetermined characterizing information is determined as described above.

BRIEF DESCRIPTION OF THE DRAWINGS

FIG. 1 is a simplified diagram of a prior art RTP chamber.

FIG. 2 is a section view diagram useful in explaining manufacture of a sichrome test wafer utilized in the calibration method of the present invention.

FIG. 5 is a graph including experimental data representing percentage changes $\Delta Rs$ in sheet resistance of the sichrome calibration wafers of FIG. 2 due to annealing for a particular anneal duration in the RTP chamber, and also including a corresponding curve of a polynomial equation that has been curve-fit to the experimental data.

FIG. 6 is a partial section view of an integrated circuit including a sichrome resistor annealed to precisely provide a desired sheet resistance.

DETAILED DESCRIPTION OF THE PREFERRED EMBODIMENTS

Figure 3:
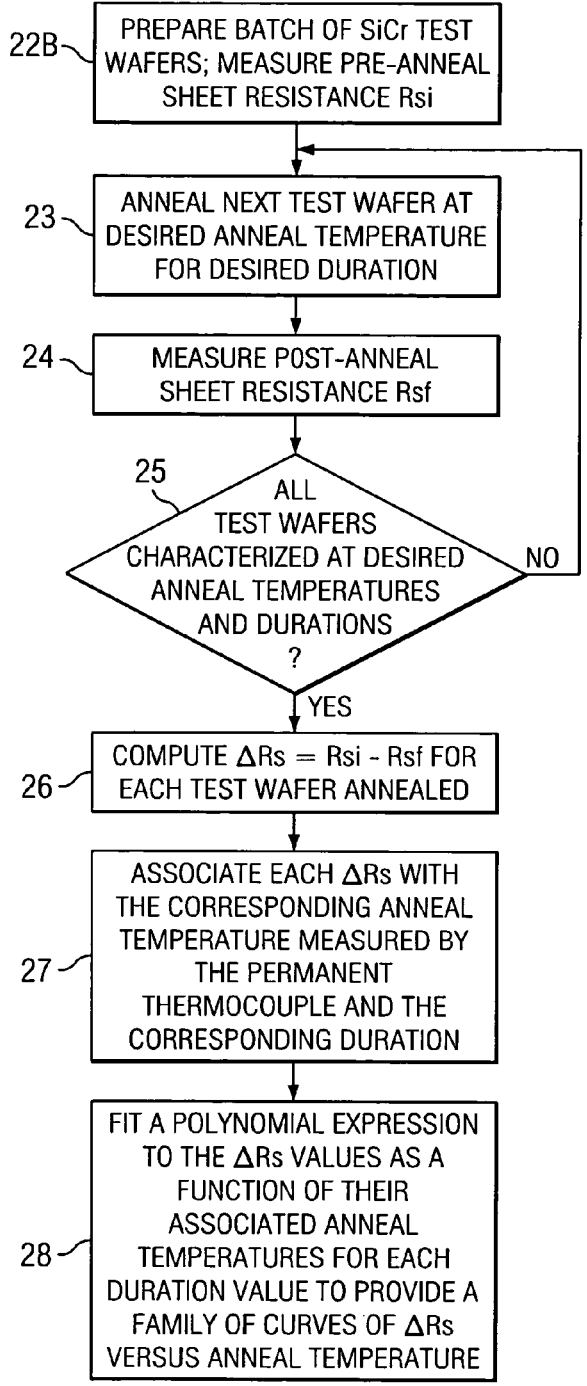
FIG. 3 is a flow chart that is useful in explaining the characterizing of sheet resistance changes $\Delta Rs$ of sichrome on the sichrome test wafers with respect to anneal temperatures and anneal durations.

The following description is directed to a method of making sichrome test wafers and using them to calibrate and/or monitor the calibration of the RTP chamber 1 previously described with reference to prior art FIG. 1. The present invention utilizes the sheet resistance change $\Delta Rs$ of a sichrome (SiCr) layer on a semiconductor wafer to determine how precisely the RTP chamber 1 is presently calibrated at any desired anneal temperature within its range, wherein the $\Delta Rs$ of the sichrome layer has previously been accurately characterized with respect to various anneal temperatures and anneal durations over at least part of the temperature range of RTP chamber 1.

Referring to FIG. 2, to prepare a batch of sichrome test wafers, a $SiO_2$ layer 21 is formed on a silicon wafer 20. $SiO_2$ layer 21 can, for example, be 2000 angstroms thick. Then a layer 22 of sichrome is deposited on oxide layer 21. Next, the initial or pre-anneal sheet resistance Rsi of sichrome layer 22 is measured for the batch of sichrome test wafers. The same value of Rsi ordinarily would be obtained for all wafers of the batch.

Changes $\Delta Rs$ in the sheet resistance of sichrome layer 22 are independent of substrate effects and also are independent of ambient atmosphere effects, because providing sichrome layer 22 on oxide layer 21, instead of directly on silicon substrate 20, completely eliminates the previously mentioned substrate effects (including the doping level and cleanliness of substrate 22) on the change $\Delta Rs$ in the sheet resistance caused by annealing of sichrome layer 22.

This is in contrast to the prior art titanium silicide test wafers, wherein the titanium is deposited directly on the silicon substrate, causing the resistivity and the $\Delta Rs$ of the titanium and the titanium silicide to be significantly affected by the properties of the substrate.

Providing sichrome layer 22 on oxide layer 21 to eliminate the substrate effects and ambient atmosphere effects therefore allows ordinary handling and storage of the sichrome test wafers before they are used to calibrate or monitor the calibration of RTP chamber 1 without significantly affecting the $\Delta Rs$ caused by annealing of sichrome layer 22, and therefore without affecting the determination of whether RTP chamber 1 needs to be re-calibrated or the determination of how much its calibration needs to be corrected.

Elimination of the substrate effects on the $\Delta Rs$ of sichrome layer 22 also is in contrast to prior art implant test wafers, wherein ions are implanted directly into the substrate and wherein the sheet resistance of the implant region may be significantly affected by the doping level of the silicon substrate.

Referring to FIG. 3, characterizing the sheet resistance change $\Delta Rs$ of sichrome test wafers with respect to anneal temperatures and anneal durations includes preparing a batch of a suitable number of sichrome test wafers and measuring (or otherwise determining) the pre-anneal sheet resistance Rsi of the sichrome layer 22 of the wafers, as indicated in block 22B. Then, as indicated in block 23, a first test wafer is placed in RTP chamber 1, which has been precisely calibrated. The first test wafer is annealed therein at a selected anneal temperature for a desired anneal duration. The selected anneal temperature is measured and recorded by means of permanent thermocouple or pyrometer 8 of RTP chamber 1. The post-anneal sheet resistance Rsf of the first sichrome test wafer then is measured, as indicated in block 24.

Next, a determination is made as to whether a suitable number of sichrome test wafers have been characterized at a suitable number of desired anneal temperatures and anneal durations, as indicated in block 25. If not, then the next wafer is placed in RTP chamber 1, and the procedure of blocks 23, 24 and 25 is repeated until a sufficient number of sichrome test wafers of the batch have been annealed at a suitable number of desired anneal temperatures and durations, respectively.

Next, as indicated in block 26 of FIG. 3, $\Delta Rs$ is computed as Rsi−Rsf and is recorded for each test wafer annealed. (Alternatively, the computation of block 26 could be performed immediately before the determination of decision block 25. Also, the measurement of post-anneal sheet resistance Rsf as indicated in block 24 can be performed after decision block 25, as long as it is performed before the $\Delta Rs$ computation of block 26.)

Then, as indicated in block 27, each $\Delta Rs$ is associated with or grouped with the corresponding anneal temperature measured in block 23 by permanent thermocouple or pyrometer 8 of RTP chamber 1. Then, as indicated in block 28, a suitable polynomial expression is curve-fit to the $\Delta Rs$ values associated with a particular anneal duration as a function of their associated anneal temperatures. This results in a family of curves of $\Delta Rs$ vs. anneal temperature, one curve for each value of anneal duration. One such curve showing the actual $\Delta Rs$ data points measured in an experiment leading up to the present invention is indicated by "B" in FIG. 5. Curve "A" in FIG. 5 represents a polynomial expression curve-fit to the data points of curve "B". In FIG. 5, $\Delta Rs$, expressed as a percentage of Rsi, is plotted for the RTP chamber temperatures of 400, 450, 500, 550, and 600 degrees Centigrade to provide curve "A". The polynomial expression can be used to accurately extrapolate reliable values of anneal temperature corresponding to values of $\Delta Rs$ between and somewhat beyond the data points of curve "A".

Figure 4:
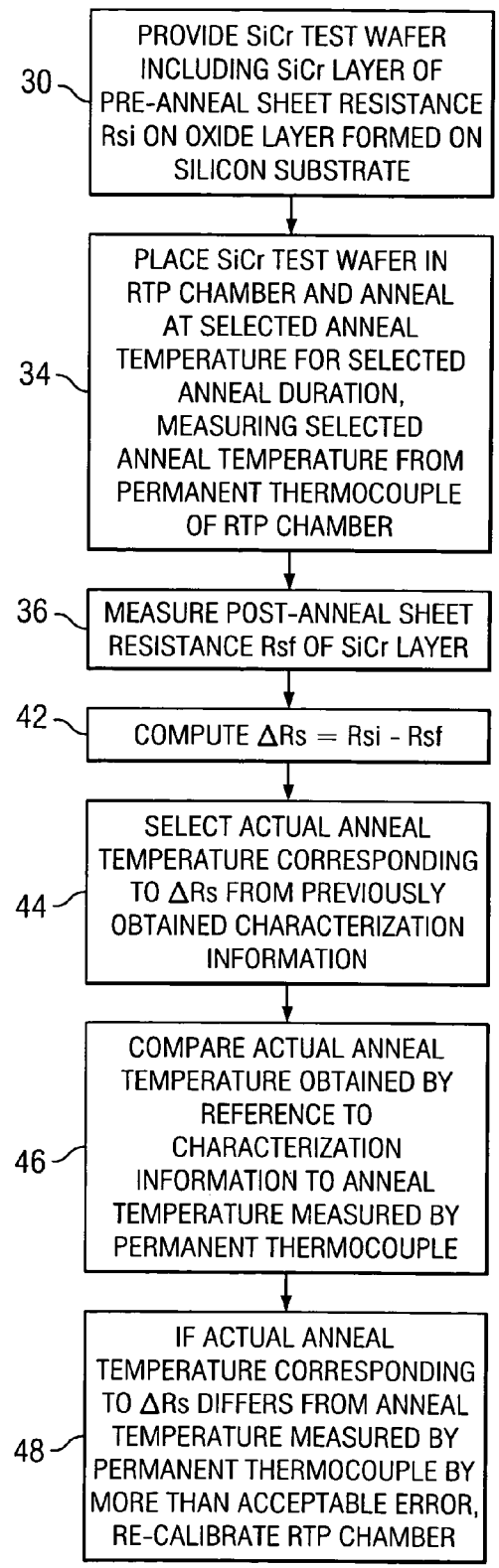
FIG. 4 is a flow chart that is useful in explaining monitoring and, if necessary, correcting the calibration of the RTP chamber of FIG. 1.

Referring to the flow chart of FIG. 4, block 30 refers to providing oxide layer 21 (or other suitable dielectric layer) on the surface of a silicon wafer 20 and depositing sichrome layer 22 on the surface of oxide layer 21, as previously described, wherein the initial or pre-anneal sheet resistance of sichrome layer 22 is Rsi ohms per square. The initial sheet resistance Rsi of sichrome layer 22 is measured using conventional techniques, for example by using a conventional four point probe.

Referring to block 34, in order to monitor the calibration of RTP chamber 1, one of the sichrome test wafers from the batch is loaded into RTP chamber 1 (through door 1A shown in FIG. 1). The temperature in RTP chamber 1, which is measured by means of a pyrometer 8, then is rapidly ramped up to a desired anneal temperature and maintained at that anneal temperature for a desired anneal duration, and then is rapidly ramped back down to the initial temperature. The sichrome test wafer then is removed from RTP chamber 1. The post-anneal sheet resistance Rsf is then measured, as indicated in block 36.

Then, the sheet resistance change $\Delta Rs$ of the annealed sichrome test wafer is computed to equal Rsi−Rsf, as indicated in block 42. Then, as indicated in block 44, an "actual" anneal temperature is determined from the previously obtained characterization information as explained above with reference to FIGS. 3 and 5.

Next, as indicated in block 46, the "actual" anneal temperature obtained by reference to the characterization information referred to in block 44 is compared to the anneal temperature measurement by pyrometer 8 during the procedure of block 34. If the "actual" anneal temperature corresponding to $\Delta Rs$ differs by more than an acceptable error from the anneal temperature measured by pyrometer 8, then RTP chamber 1 is re-calibrated in accordance with the value of $\Delta rs$, as indicated in block 48.

This procedure may be repeated for additional test wafers of the first batch at a number of different test temperatures, respectively, to obtain corresponding values of $\Delta Rs$ if it is desired to monitor and/or correct the calibration of RTP chamber 1 at the different test temperatures. Such monitoring of RTP chamber 1 can be performed frequently by an operator of only ordinary skill, using 5 sichrome test wafers, for example, and can be accomplished in as little as about half an hour, because there is no need to undergo the inconvenience and time required to connect and use a thermocouple wafer as previously described.

Referring to FIG. 6, an integrated circuit structure includes a silicon wafer substrate 20 having a layer of oxide 21 thereon. A layer of sichrome deposited on oxide layer 21 has been patterned to provide a resistor 22A. Various other features of a typical integrated circuit, such as field oxide, contact openings located over the opposite ends of sichrome resistor 22A, metallization for making electrical contact to the terminals of sichrome resistor 22A, and various other integrated circuit components such as transistors, etc., are omitted for simplicity.

The above described curves (for example as described with reference to FIG. 5) developed according to the flow chart of FIG. 3 can be used in conjunction with RTP chamber 1 to very precisely anneal sichrome resistor 22A to reduce its sheet resistance from a known pre-anneal value to a desired post-anneal value by selecting the value of $\Delta Rs$ required to reduce the sheet resistance from its pre-anneal value to the desired post-anneal value, and selecting the anneal temperature and anneal duration needed to accomplish the desired sheet resistance reduction. The resistors thus thermally treated are not only set to certain values with a certain temperature coefficient of resistance, but they also become thermally stable and do not require another stabilizing thermal treatment.

To summarize, the invention provides a convenient, accurate method of monitoring the calibration of an RTP chamber using sichrome test wafers, the sheet resistance changes $\Delta Rs$ of which are independent of the previously described substrate effects and the ambient atmosphere effects (due, for example, to contamination from prior metal deposition processes performed in the RTP chamber). The invention provides accurate $\Delta Rs$ characterization information in temperature ranges in which such information cannot be obtained using implant test wafers or silicide test wafers. Consequently, invention makes it possible for an operator of ordinary skill, rather than higher level technical personnel, to quickly monitor the accuracy of the calibration of RTP equipment without use of a thermocouple wafer. Since sichrome does not easily oxidize, the sichrome test wafers can be prepared in large batches and easily stored. Another advantage is that a small leak in the RTP equipment will not affect monitoring the calibration thereof because the sichrome does not react to oxygen or nitrogen. The invention also provides a method of conveniently annealing sichrome resistors in an integrated circuit to precisely adjust the resistances thereof.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, the described technique can be used to adjust resistive parameters of a sichrome resistor other than sheet resistance. For example, the basic described technique can be used to adjust the absolute resistivity or the TCR (temperature coefficient of resistance) of a sichrome resistor.

What is claimed is:

1. A method of determining the accuracy of calibration of an RTP chamber, comprising:
   (a) providing a test wafer including a sichrome layer on an insulating layer, wherein the insulating layer is formed on a silicon substrate, and wherein the sichrome layer having a pre-anneal sheet resistance Rsi;
   (b) placing the test wafer in the RTP chamber and subjecting the test wafer to a predetermined annealing at a predetermined anneal temperature as measured by a temperature sensor in the RTP chamber for a predetermined anneal duration;
   (c) measuring a sheet resistance of the sichrome layer to determine a post-anneal sheet resistance Rsf;
   (d) computing a sheet resistance change $\Delta Rs$ of the sichrome layer by subtracting the post-anneal sheet resistance Rsf from the pre-anneal sheet resistance Rsi;
   (e) determining an actual value of an anneal temperature corresponding to the computed sheet resistance change $\Delta Rs$ from predetermined characterizing information representative of $\Delta Rs$ of the sichrome layer as a function of anneal temperature and anneal duration; and
   (f) determining the accuracy of calibration of the RTP chamber by determining the difference between the actual anneal temperature determined in step (e) and the predetermined anneal temperature as measured by the temperature sensor.

2. The method of claim 1 wherein the temperature sensor is a permanent temperature sensor.

3. The method of claim 2 wherein the temperature sensor includes a thermocouple.

4. The method of claim 2 wherein the temperature sensor is a pyrometer.

5. The method of claim 1 wherein the pre-anneal sheet resistance Rsi and the post-anneal sheet resistance Rsf are determined by means of a four-point sheet resistance probe measuring technique.

6. The method of claim 1 including obtaining the predetermined characterizing information representative of $\Delta Rs$ of the sichrome layer by
   i. preparing a batch of sichrome test wafers each having a sichrome layer on an oxide layer formed on a substrate, the sichrome layers having a pre-anneal sheet resistance Rsi;
   ii. annealing the test wafers at a various desired anneal temperatures for the predetermined anneal duration;
   iii. computing a sheet resistance change $\Delta Rs=Rsi-Rsf$ of each annealed test wafer caused by the annealing; and
   iv. forming groups of $\Delta Rs$ values of test wafers having the same anneal durations, respectively, to represent $\Delta Rs$ as a function of anneal temperature for each anneal duration value.

7. The method of claim 1 including obtaining the predetermined characterizing information representative of ΔRs of the sichrome layer by
   i. preparing a batch of sichrome test wafers each having a sichrome layer on an oxide layer formed on a substrate, the sichrome layers having a pre-anneal sheet resistance Rsi;
   ii. annealing the test wafers at a various desired anneal temperatures for various desired anneal durations, respectively;
   iii. computing a sheet resistance change ΔRs=Rsi−Rsf of each annealed test wafer caused by the annealing; and
   iii. forming groups of ΔRs values of test wafers having the same anneal durations, respectively, to represent ΔRs as a function of anneal temperature for each anneal duration value.

8. The method of claim 6 wherein step (ii) includes annealing the test wafers in the RTP chamber.

9. The method of claim 6 including fitting a polynomial expression to the ΔRs values of test wafers having a selected anneal duration to represent a ΔRs vs. anneal temperature curve for the selected anneal duration.

10. The method of claim 1 wherein the predetermined anneal temperature of step (b) is in the range from 300 to 1200 degrees Centigrade.

11. The method of claim 1 wherein the predetermined anneal duration is in the range from approximately 30 seconds to approximately 5 minutes.

12. A method of avoiding use of a thermocouple wafer in determining the accuracy of calibration of an RTP chamber anywhere in the range from approximately 300 degrees Centigrade to approximately 1200 degrees Centigrade, comprising:
   (a) providing a test wafer including a deposited sichrome layer on an insulating layer, wherein the insulated layer is formed on a silicon substrate, and wherein the sichrome layer having a pre-anneal sheet resistance Rsi;
   (b) placing the test wafer in the RTP chamber and subjecting the test wafer to a predetermined annealing at a predetermined anneal temperature as measured by a temperature sensor in the RTP chamber for a predetermined anneal duration;
   (c) measuring a sheet resistance of the sichrome layer to determine a post-anneal sheet resistance Rsf;
   (c) computing a sheet resistance change ΔRs of the sichrome layer by subtracting the post-anneal sheet resistance Rsf from the pre-anneal sheet resistance Rsi;
   (d) determining an actual value of an anneal temperature corresponding to the computed sheet resistance change ΔRs from predetermined characterizing information representative of ΔRs of the sichrome layer as a function of anneal temperature and anneal duration; and
   (e) determining the accuracy of calibration of the RTP chamber by determining the difference between the actual anneal temperature determined in step (e) and the predetermined anneal temperature as measured by the sensor.

13. A method of avoiding use of a thermocouple wafer, implant test wafer, or silicide test wafer in determining the accuracy of calibration of an RTP chamber anywhere in the range from approximately 300 degrees Centigrade to approximately 1200 degrees Centigrade, comprising:
   (a) providing a test wafer including a sichrome layer on an insulating layer, wherein the insulated layer is formed on a silicon substrate, and wherein the sichrome layer having a pre-anneal sheet resistance Rsi;
   (b) placing the test wafer in the RTP chamber and subjecting the test wafer to a predetermined annealing at a predetermined anneal temperature as measured by a temperature sensor in the RTP chamber for a predetermined anneal duration;
   (c) measuring a sheet resistance of the sichrome layer to determine a post-anneal sheet resistance Rsf;
   (d) computing a sheet resistance change ΔRs of the sichrome layer by subtracting the post-anneal sheet resistance Rsf from the pre-anneal sheet resistance Rsi;
   (e) determining an actual value of an anneal temperature corresponding to the computed sheet resistance change ΔRs from predetermined characterizing information representative of ΔRs of the sichrome layer as a function of anneal temperature and anneal duration; and
   (f) determining the accuracy of calibration of the RTP chamber by determining the difference between the actual anneal temperature determined in step (e) and the predetermined anneal temperature as measured by the sensor.

14. A method of calibrating an RTP chamber, comprising:
   (a) determining the accuracy of the calibration of the RTP chamber by
      i. providing a test wafer including a deposited sichrome layer on an insulating layer, wherein the insulated layer is formed on a silicon substrate, and wherein the sichrome layer having a pre-anneal sheet resistance Rsi,
      ii. placing the test wafer in the RTP chamber and subjecting the test wafer to a predetermined annealing at a predetermined anneal temperature as measured by a temperature sensor in the RTP chamber for a predetermined anneal duration,
      iii. measuring a sheet resistance of the sichrome layer to determine a post-anneal sheet resistance Rsf,
      iv. computing a sheet resistance change ΔRs of the sichrome layer by subtracting the post-anneal sheet resistance Rsf from the pre-anneal sheet resistance Rsi,
      v. determining an actual value of an anneal temperature corresponding to the computed sheet resistance change ΔRs from predetermined characterizing information representative of ΔRs of the sichrome layer as a function of anneal temperature and anneal duration, and
      vi. determining the difference between the actual value of an anneal temperature determined in step (v) referred to in step (ii) and the predetermined anneal temperature as measured by the temperature sensor; and
   (b) re-calibrating the RTP chamber if the actual anneal temperature corresponding to the computed sheet resistance change ΔRs differs from the predetermined anneal temperature as measured by the temperature sensor by more than an acceptable error.

15. The method of claim 14 including performing the recalibrating of step (b) by controlling a heating element in RTP chamber so as to cause an actual temperature in RTP chamber to precisely match a value representing the predetermined anneal temperature produced in response to the thermocouple or pyrometer.

16. The method of claim 14 including performing the recalibrating of step (b) by modifying a value representing the predetermined anneal temperature produced in response to the thermocouple or pyrometer so the value precisely matches the actual temperature in the RTP chamber.

17. The method of claim 14 including obtaining the predetermined characterizing information representative of ΔRs of the sichrome layer by i. preparing a batch of sichrome test wafers each having a sichrome layer on an oxide layer formed on a substrate, the sichrome layers having a pre-anneal sheet resistance Rsi;

ii. annealing the test wafers at a various desired anneal temperatures for the predetermined anneal duration;

iii. computing a sheet resistance change ΔRs=Rsi−Rsf of each annealed test wafer caused by the annealing; and iv. forming groups of ΔRs values of test wafers having the same anneal durations, respectively, to represent ΔRs as a function of anneal temperature for each anneal duration value.

18. The method of claim 14 wherein the temperature sensor is a permanent temperature sensor.

19. The method of claim 18 wherein the temperature sensor includes a thermocouple.

20. The method of claim 18 wherein the temperature sensor is a pyrometer.

21. The method of claim 17 wherein step (ii) includes annealing the test wafers in the RTP chamber.

22. The method of claim 17 including fitting a polynomial expression to the ΔRs values of test wafers having a selected anneal duration to represent a ΔRs vs. anneal temperature curve for the selected anneal duration.

23. The method of claim 14 wherein the predetermined anneal temperature of step (b) is in the range from 300 to 1200 degrees Centigrade.

* * * * *